United States Patent
Kasai

(10) Patent No.: US 12,356,508 B2
(45) Date of Patent: Jul. 8, 2025

(54) HEATER TEMPERATURE CONTROL METHOD, HEATER, AND PLACEMENT STAND

(71) Applicant: TOKYO ELECTRON LIMITED, Tokyo (JP)

(72) Inventor: Shigeru Kasai, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1009 days.

(21) Appl. No.: 17/425,285

(22) PCT Filed: Jan. 16, 2020

(86) PCT No.: PCT/JP2020/001257
§ 371 (c)(1),
(2) Date: Jul. 22, 2021

(87) PCT Pub. No.: WO2020/153224
PCT Pub. Date: Jul. 30, 2020

(65) Prior Publication Data
US 2022/0151026 A1    May 12, 2022

(30) Foreign Application Priority Data
Jan. 25, 2019   (JP) ................. 2019-011538

(51) Int. Cl.
| | |
|---|---|
| H05B 3/03 | (2006.01) |
| H01L 21/02 | (2006.01) |
| H05B 3/74 | (2006.01) |

(52) U.S. Cl.
CPC ............. *H05B 3/03* (2013.01); *H01L 21/02* (2013.01); *H05B 3/74* (2013.01); *H05B 2213/07* (2013.01)

(58) Field of Classification Search
CPC ........ H05B 3/03; H05B 3/74; H05B 2213/07; H05B 1/0233; H01L 21/02; H01L 21/67248; H01L 21/67103
See application file for complete search history.

(56) References Cited

U.S. PATENT DOCUMENTS

| | | | |
|---|---|---|---|
| 11,234,297 B2 * | 1/2022 | Kim ................. | H05B 3/84 |
| 2011/0061628 A1 * | 3/2011 | Fujita .............. | F02D 35/023 |
| | | | 123/406.47 |

(Continued)

FOREIGN PATENT DOCUMENTS

| | | |
|---|---|---|
| CN | 107690206 A | 2/2018 |
| JP | H02216787 A * | 2/1989 |

(Continued)

OTHER PUBLICATIONS

PCT International Search Report and Written Opinion, PCT Application No. PCT/JP2020/001257, Mar. 10, 2020, 8 pages (with English translation of PCT International Search Report).

*Primary Examiner* — Tiffany T Tran
(74) *Attorney, Agent, or Firm* — Fenwick & West LLP

(57) ABSTRACT

Disclosed is a method for controlling the temperature of a heater which has a single plate-shaped member formed of a semiconductor substrate, and three or more electrodes formed on a side surface of the single plate-shaped member while being spaced apart from each other in a circumference direction, the method comprising a step for heating the plate-shaped member by supplying a power between the electrodes and sequentially changing the pair of electrodes to which the power is supplied, wherein a period of time in which the power is supplied between the electrodes in the heating step is individually determined for each set of electrodes.

5 Claims, 12 Drawing Sheets

(56) References Cited

U.S. PATENT DOCUMENTS

| | | | |
|---|---|---|---|
| 2014/0355647 A1* | 12/2014 | Lee | H10N 30/03 29/25.35 |
| 2018/0095562 A1* | 4/2018 | Hashida | G06F 3/0446 |
| 2019/0250484 A1* | 8/2019 | Sakamoto | G02F 2/02 |

FOREIGN PATENT DOCUMENTS

| | | | |
|---|---|---|---|
| JP | 02216787 A | * | 8/1990 |
| JP | 2005-251560 A | | 9/2005 |
| JP | 2007-35476 A | | 2/2007 |
| JP | 2007-299546 A | | 11/2007 |

* cited by examiner

FIG.11

| STEP | Tr1 | Tr2 | Tr3 | Tr4 | Tr5 | Tr6 | Tr7 | Tr8 |
|------|-----|-----|-----|-----|-----|-----|-----|-----|
| 1 | aON | bON | bON | bON | bON | bON | bON | bON |
| 2 | bON | aON | bON | bON | bON | bON | bON | bON |
| 3 | bON | bON | aON | bON | bON | bON | bON | bON |
| 4 | bON | bON | bON | aON | bON | bON | bON | bON |
| 5 | bON | bON | bON | bON | aON | bON | bON | bON |
| 6 | bON | bON | bON | bON | bON | aON | bON | bON |
| 7 | bON | bON | bON | bON | bON | bON | aON | bON |
| 8 | bON | bON | bON | bON | bON | bON | bON | aON |

HIGH SIDE ON   HEATING REGION 1   HEATING REGION 2

HEATING REGION 3   HEATING REGION 4

HEATER TEMPERATURE CONTROL METHOD, HEATER, AND PLACEMENT STAND

TECHNICAL FIELD

The present disclosure relates to a heater temperature control method, a heater, and a placement stand.

BACKGROUND

Patent Document 1 discloses a silicon heater configured to uniformly heat a wafer placed thereon. In the silicon heater disclosed in Patent Document 1, band-shape terminals are provided along an outer circumference of a silicon plate to face each other, and at least one slit is formed at a central portion of the silicon plate to extend in a direction crossing a line that connects the band-shape terminals.
(Patent Document 1) Japanese Patent Application Publication No. 2005-251560

SUMMARY

The present disclosure provides a technique for easily obtaining desired in-plane temperature distribution in a heater that can be manufactured at a low cost.

In accordance with an aspect of the present disclosure, there is provided a method of controlling a temperature of a heater that includes a single plate-shaped member formed of a semiconductor substrate, and three or more electrodes formed on a side surface of the single plate-shaped member while being spaced apart from each other in a circumference direction, the method including: heating the plate-shaped member by conducting current between the electrodes and sequentially switching a set of the conducting electrodes among the electrodes. Further, in the heating, a conducting time period for conducting the current between the conducting electrodes is set for each set of the conducting electrodes.

Effect of the Invention

In the present disclosure, it is possible to easily obtain desired in-plane temperature distribution in the heater that can be manufactured at a low cost.

BRIEF DESCRIPTION OF THE DRAWINGS

FIG. 11 shows transistors of a switching unit in an ON state in each heating process of a temperature control process.

DETAILED DESCRIPTION

Figure 1:
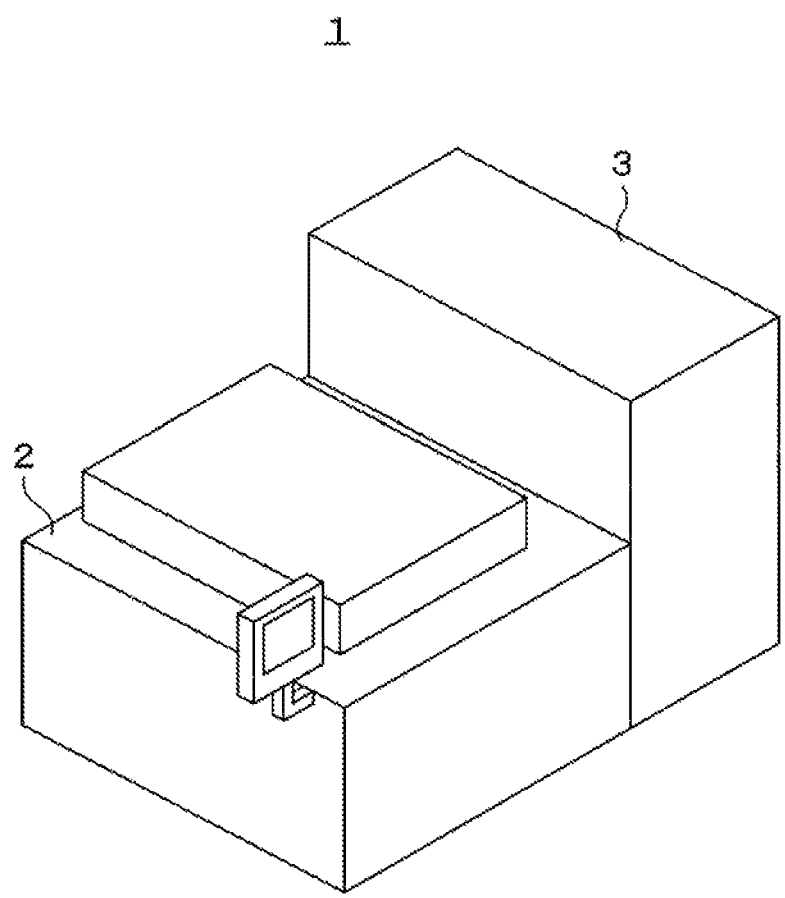
FIG. 1 is a perspective view showing a schematic configuration of an inspection apparatus including a placement stand according to an embodiment.

In a semiconductor manufacturing process, a plurality of electronic devices, each having a desired circuit pattern, is formed on a semiconductor wafer (hereinafter referred to as "wafer"). Electrical characteristics of the electronic devices formed on the wafer are inspected and the electronic devices are classified into non-defective products or defective products. For example, the electronic devices on the wafer are inspected with an inspection apparatus before the wafer is divided into the electronic devices.

Recently, in some inspection apparatuses, a heating unit may be disposed at a placement stand on which the wafer is placed so that the electrical characteristics of the electronic devices can be inspected at a high temperature.

Further, in the semiconductor manufacturing process, a film forming apparatus performs film formation on the wafer, or an etching apparatus performs etching on the wafer. The heating unit is also disposed at the placement stand of the film forming apparatus or the etching apparatus.

During the inspection, the film formation or the like, the wafer is heated such that desired in-plane temperature distribution (e.g., in-plane uniformity) is obtained.

Patent Document 1 described above discloses a silicon heater configured to uniformly heat a wafer placed thereon. In the silicon heater disclosed in Patent Document 1, band-shape terminals are provided along an outer circumference of a silicon plate to face each other, and at least one slit is formed at a central portion of the silicon plate to extend in a direction crossing a line that connects the band-shape terminals.

However, in the stage heater having the slit as disclosed in Patent Document 1, it is difficult to adjust the in-plane temperature distribution after the fabrication of the stage heater is completed. Therefore, when it is determined that the desired in-plane temperature distribution cannot be obtained after the fabrication of the stage heater is completed, it is difficult to obtain the desired in-plane temperature distribution.

A configuration for obtaining desired in-plane temperature distribution may be, e.g., a configuration in which a silicon heater is divided into multiple parts and controlled for each part, or a configuration in which an in-plane impurity concentration of a silicon substrate used for a silicon heater is partially adjusted. However, in the former configuration, wiring each divided part takes time, which leads to the difficulty of the fabrication. Further, in the latter configuration, the cost increases because the silicon substrate in which the in-plane impurity concentration is partially adjusted is expensive.

Therefore, the present disclosure provides a technique for easily obtaining desired in-plane temperature distribution in a heater that can be easily manufactured at a low cost.

Hereinafter, a heater temperature control method, a heater, and a placement stand according to an embodiment will be described with reference to the accompanying drawings. In this specification and the drawings, like reference numerals will be given to like parts having substantially the same functions, and redundant description thereof will be omitted.

Figure 2:
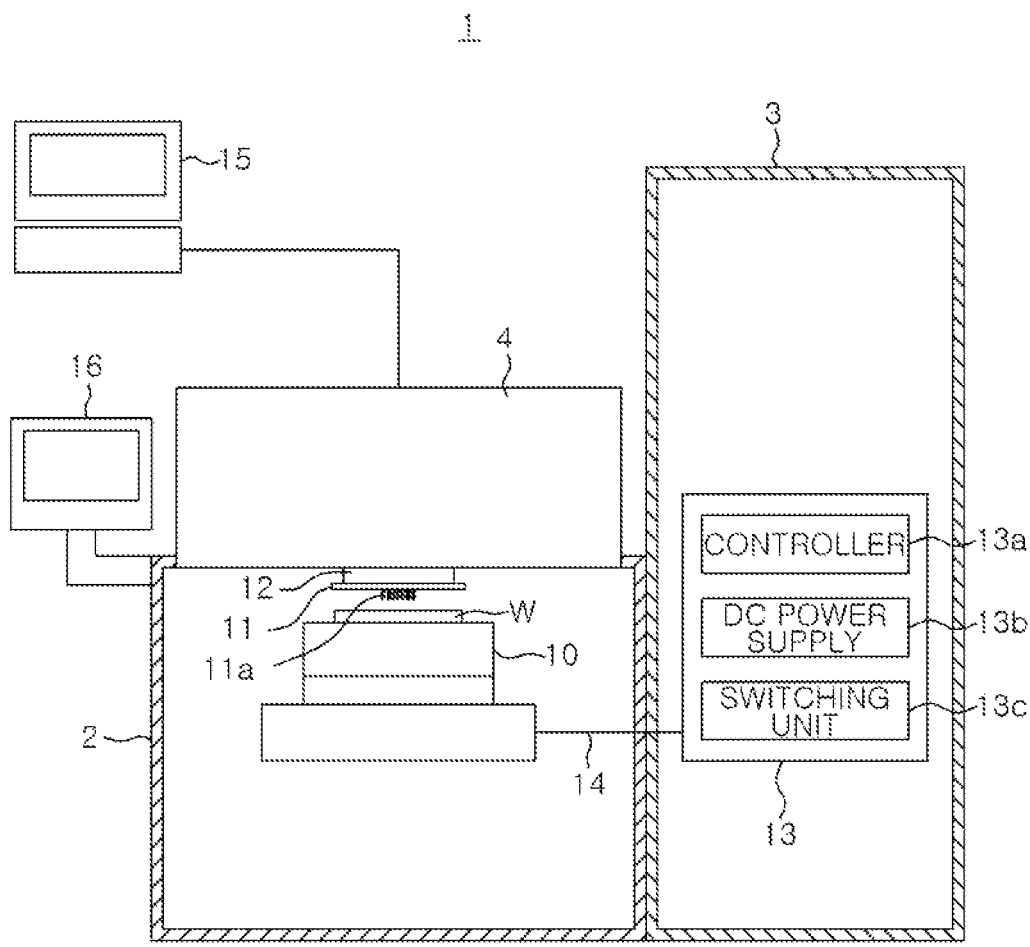
FIG. 2 is a front view showing the schematic configuration of the inspection apparatus including the placement stand according to the embodiment.

First, a configuration of an inspection apparatus to which the placement stand according to the embodiment is applied will be described. FIGS. 1 and 2 are a perspective view and a front view, respectively, each showing a schematic configuration of an inspection apparatus 1 having the placement stand according to the embodiment. In FIG. 2, in order to show components provided in an accommodating chamber and a loader to be described later of the inspection apparatus 1 of FIG. 1, a part of the inspection apparatus 1 is shown in cross section.

The inspection apparatus 1 inspects electrical characteristics of electronic devices (not shown) formed on a wafer W as a processing target. As shown in FIGS. 1 and 2, the inspection apparatus 1 includes an accommodating chamber 2 accommodating a wafer W during inspection, a loader 3 disposed adjacent to the accommodating chamber 2, and a tester 4 disposed to cover the accommodating chamber 2.

The accommodating chamber 2 is a hollow housing and has therein a stage 10 as a placement stand on which the wafer W as an inspection target is placed. The stage 10 attracts and holds the wafer W to prevent displacement of the position of the wafer W with respect to the stage 10. The stage 10 is configured to be movable in a horizontal direction and a vertical direction. With this configuration, the electrodes on the surface of the wafer W can be brought into contact with probes 11a of a probe card 11 to be described later by adjusting the relative position of the probe card 11 and the wafer W.

The probe card 11 is disposed above the stage 10 in the accommodating chamber 2 so as to face the stage 10. The probe card 11 has the probes 11a to be in electrical contact with the electrodes of the electronic devices or the like on the wafer W.

Further, the probe card 11 is connected to a tester 4 through an interface 12. When the probes 11a are brought into contact with the electrodes of each electronic device of the wafer W during the electrical characteristic inspection, the probes 11a supply a signal from the tester 4 to the electronic device through the interface 12 and supply a signal from the electronic device to the tester 4 through the interface 12.

The loader 3 is configured to extract a wafer W accommodated in a FOUP (not shown) that is a transfer container and transfer the wafer W to the stage 10 of the accommodating chamber 2. Further, the loader 3 receives the wafer W for which the electrical characteristic inspection of the electronic device has been completed from the stage 10 and accommodates the wafer W in the FOUP.

Further, the loader 3 has a base unit 13. The base unit 13 has a controller 13a for performing various controls related to the stage 10, and is connected to the stage 10 through a wiring 14.

Although not shown, the controller 13a of the base unit 13 includes a program storage unit having a CPU, a memory, and the like. The program storage unit stores programs for controlling various processes in the controller 13a, such as a temperature control process of a heater 130 (to be described later) for controlling a temperature of an electronic device as an inspection target. The program may be recorded in a computer-readable storage medium and may be installed into the controller 13a from the storage medium. A part or all of the programs may be realized by dedicated hardware (circuit board).

The controller 13a controls a voltage applied to the heater 130 to be described later or a flow rate of a cooling medium to a cooling layer including a lid layer 140 and a groove layer 150 that will be described later based on, e.g., a temperature of the electronic device of the wafer W or a temperature of a ceiling layer 110 (to be described later) of the stage 10.

The base unit 13 further includes a DC power supply 13b and a switching unit 13c. The DC power supply 13b and the switching unit 13c will be described later.

The base unit 13 may also be disposed in the accommodating chamber 2.

The tester 4 includes a test board (not shown) that implements a part of a circuit configuration of a motherboard on which the electronic devices are installed. The test board is connected to a tester computer 15 that is configured to determine whether the electronic devices are defective or non-defective based on the signals from the electronic devices. In the tester 4, it is possible to implement the circuit configurations of various types of motherboards by replacing the test board.

Further, the inspection apparatus 1 includes a user interface unit 16 for displaying information for a user or for allowing a user to input a command. The user interface unit 16 includes, e.g., an input unit such as a touch panel or a keyboard, and a display unit such as a liquid crystal display or the like.

In the inspection apparatus 1 having the above-described components, when the electrical characteristics of the electronic devices are inspected, the tester computer 15 transmits data to the test board connected to the electronic devices via each probe 11a. Then, the tester computer 15 determines whether or not the transmitted data has been correctly processed by the test board based on the electrical signals from the test board.

Figure 3:
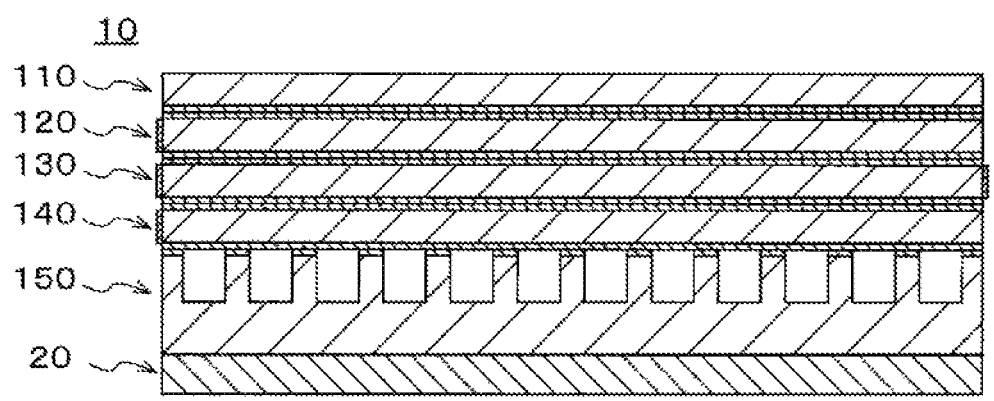
FIG. 3 is a cross-sectional view schematically showing a configuration of a stage of FIG. 2.
Figure 4:
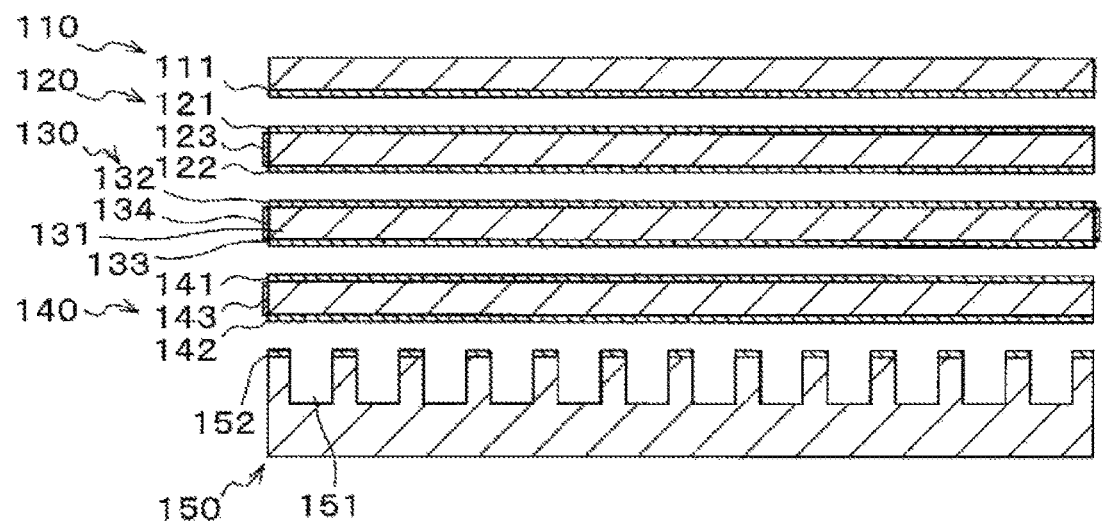
FIG. 4 is a cross-sectional view showing the stage of FIG. 2 that is divided into layers.

Next, a configuration of the stage 10 will be described with reference to FIGS. 3 and 4. FIG. 3 is a cross-sectional view schematically showing the configuration of the stage 10. FIG. 4 is a cross-sectional view showing the stage 10 divided into layers in order to show each layer constituting the stage 10.

As shown in FIGS. 3 and 4, the stage 10 is formed by laminating multiple layers including the heater 130 as a heating layer and the like. The stage 10 is placed on a moving mechanism (not shown) for moving the stage 10 in the horizontal direction and the vertical direction via a heat insulating portion 20. The heat insulating portion 20 is made of, e.g., resin, graphite, ceramic having low thermal conductivity, or the like.

In the illustrated example, the multiple layers of the stage 10 include the ceiling layer 110, an electromagnetic shield layer 120, the heater 130, the lid layer 140, and the groove layer 150 laminated in that order from the top. As will be described below, each of the layers is formed of a silicon (Si) single crystal substrate.

The wafer W is placed on the surface of the ceiling layer 110. The ceiling layer 110 is made of a Si single crystal substrate, and a Si oxide film 111 as an oxide film is formed on a back surface of the ceiling layer 110.

The electromagnetic shield layer 120 is disposed between the ceiling layer 110 and the heater 130, and suppresses emission of electromagnetic waves generated by the heater 130 from the ceiling layer 110 side of the stage 10 to the outside. The electromagnetic shield layer 120 is made of a Si single crystal substrate added with high-concentration impurities and having high conductivity. Si oxide films 121 and 122 are formed on a front surface and a back surface of the electromagnetic shield layer 120, respectively, and an electrode 123 is formed on a side surface of the electromagnetic shield layer 120. The electromagnetic shield layer 120 is connected to a ground potential or a potential having a low output impedance through the electrode 123.

The heater 130 heats the ceiling layer 110 and is disposed on the back surface side of the ceiling layer 110, and more specifically, directly below the electromagnetic shield layer 120. The heater 130 has one plate-shaped member 131 made of a Si single crystal substrate as a semiconductor substrate, and a Si single crystal substrate added with high-concentration impurities and having high conductivity is used as the Si single crystal substrate forming the plate-shaped member 131. Further, the heater 130 has Si oxide films 132 and 133 formed on the front surface and the back surface of the plate-shaped member 131 to cover substantially the entire front surface and the entire back surface, respectively, and electrodes 134 formed on the side surface of the plate-shaped member 131.

The heater 130 will be described in detail later.

The lid layer 140 and the groove layer 150 function as a cooling layer. The cooling layer is disposed on the back surface side of the ceiling layer 110 to cool the ceiling layer 110 using a cooling medium.

The groove layer 150 has grooves 151 that open in one direction (upward in FIG. 3) in a stacking direction in the stage 10. The groove layer 150 is made of a Si single crystal substrate, and a Si oxide film 152 and the grooves 151 are formed on the surface of the groove layer 150 facing the lid layer 140.

The lid layer 140 is disposed to cover the openings of the grooves 151 of the groove layer 150, and forms a channel together with the grooves 151. Cooling water as a cooling medium flows through the channel. In the present embodiment, the lid layer 140 also serves as an electromagnetic shield layer for suppressing emission of the electromagnetic waves generated by the heater 130 from the back side (opposite to the ceiling layer 110) of the stage 10 to the outside. When the electromagnetic waves are emitted from the back side of the stage 10, the electromagnetic waves may be reflected in the accommodating chamber 2 of the inspection apparatus 1 and reach the wafer W, which may affect the electrical characteristic inspection. The electromagnetic shield layer is provided to prevent such a drawback.

The lid layer 140 is made of a Si single crystal substrate added with high-concentration impurities and having high conductivity. Si oxide films 141 and 142 are formed on the front surface and the back surface of the lid layer 140, respectively, and an electrode 143 is formed on a side surface of the lid layer 140. The lid layer 140 is connected to a ground potential or a potential having a low output impedance through the electrode 143.

Figure 5:
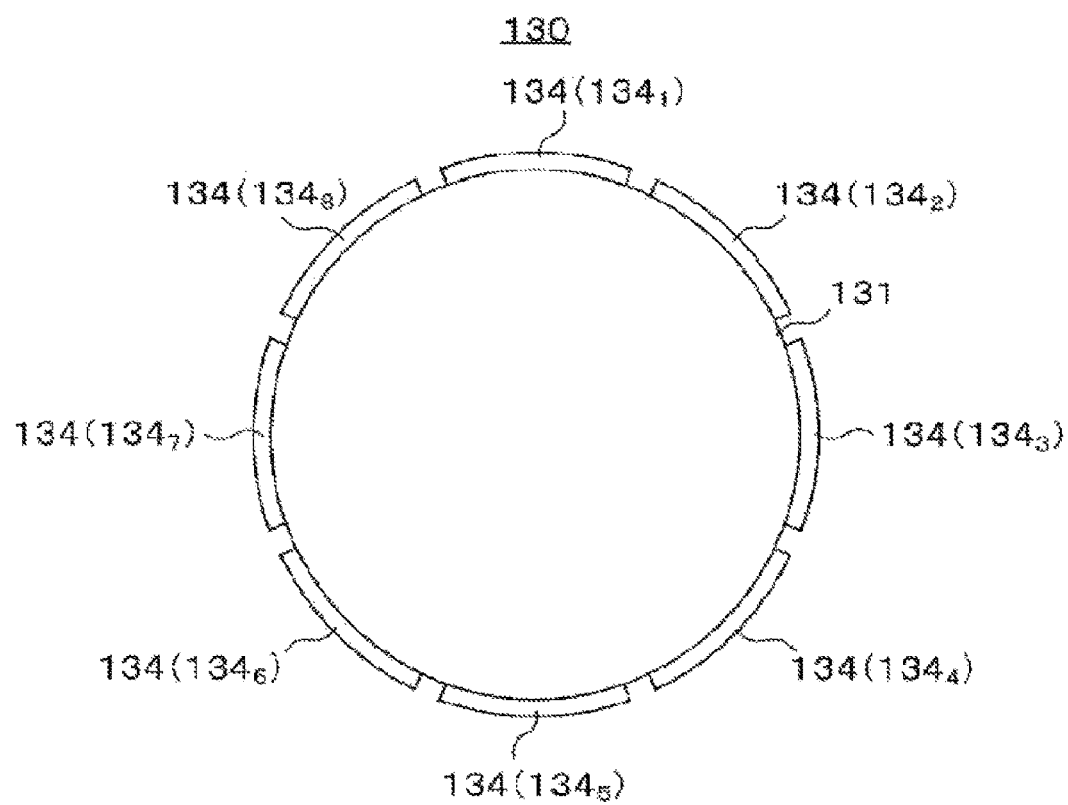
FIG. 5 is a top view schematically showing a configuration of a heater of FIG. 3.

Next, the configuration of the heater 130 will be described with reference to FIG. 5. FIG. 5 is a top view schematically showing the configuration of the heater 130. In FIG. 5, the Si oxide films 132 and 133 are not illustrated.

As described above, the heater 130 has one plate-shaped member 131, the Si oxide film 132 and 133, and the electrodes 134.

As shown in FIG. 5, the heater 130 has a circular shape in a plan view, for example. The plate-shaped member 131 also has a circular shape in a plan view, for example.

Three or more electrodes 134 are formed on the side surface of the plate-shaped member 131 so as to be circumferentially spaced apart from one another at equal intervals, for example. In the illustrated example, eight electrodes 134 are formed. In the following description, the electrodes 134 may be described as first to eight electrodes $134_1$ to $134_8$ in a clockwise direction from the upper side of FIG. 5.

The DC power supply 13b (see FIG. 2) is connected to the electrode 134 through the switching unit 13c (see FIG. 2).

The DC power supply 13b supplies a DC power. The plate-shaped member 131 can be heated by supplying the DC power from the DC power supply 13b to conduct current between the electrode 134 and the other electrodes 134. The electrodes 134 may be combined in various sets, and the set of electrodes 134 to which the DC power supply 13b supplies the DC power at each time point is one of the various sets of electrodes 134.

The switching unit 13c switches the set of electrodes 134 to which the DC power from the DC power supply 13b is supplied. Since the switching unit 13c sequentially switches the set of electrodes 134 to which the DC power from the DC power supply 13b is supplied under the control of the controller 13a, the portion heated by the heater 130 can be switched.

Figure 6:
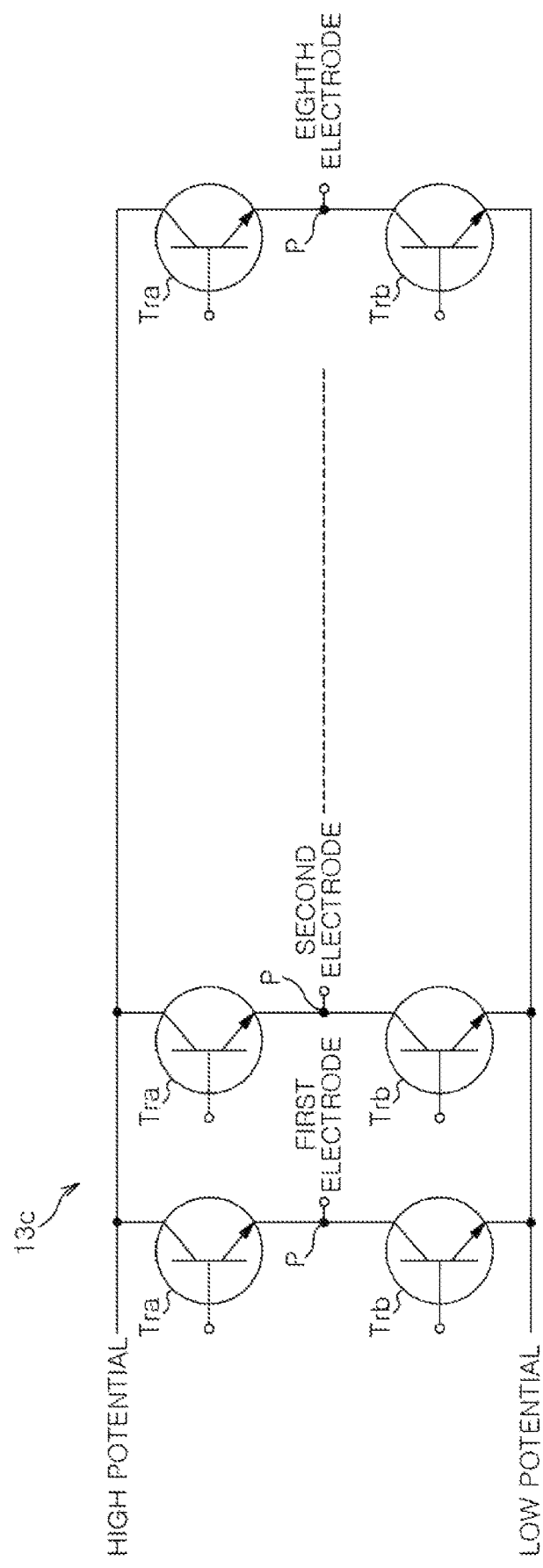
FIG. 6 is a circuit diagram explaining a configuration of a switching unit.

FIG. 6 is a circuit diagram explaining a schematic configuration of the switching unit 13c.

As shown in FIG. 6, the switching unit 13c has transistor pairs each pair of which is formed by connecting an emitter of a transistor Tra connected to a high potential side and a collector of a transistor Trb connected to a low potential side. The switching unit 13c is formed by connecting the transistor pairs in parallel while the number of the transistor pairs is the same as the number of electrodes 134. Further, the electrode 134 (any one of the first to eighth electrodes $134_1$ to $134_8$) corresponding to each transistor pair is connected to a connection portion P between the emitter of the transistor Tra and the collector of the transistor Trb in the corresponding transistor pair.

Next, the process of controlling a temperature of the heater 130 of the present embodiment will be described with reference to FIGS. 7 to 10. FIGS. 7 to 10 explain a relationship between a heating region to be described later and the set of electrodes 134 used for heating the heating region. Arrows in FIGS. 7 to 10 indicate the sets of electrodes 134 respectively used for heating the heating regions.

In the process of controlling a temperature of the heater 130 of the present embodiment, as shown in FIGS. 7 to 10, the heater 130 is divided into multiple regions in a radial direction and generates heat for each divided region. Specifically, the plate-shaped member 131 is divided into multiple regions in the radial direction and heated for each divided region. In the following description, each divided region of the plate-shaped member 131 is set to a heating region R. For example, if the number of electrodes is denoted by n, the number of divided regions of the plate-shaped member 131, i.e., the number of heating regions R, is equal to n/2 (8/2=4 in this example). Positional relationship of the electrodes 134 constituting each set of electrodes 134 used for heating the corresponding heating region R is determined depending on each heating region R. In the following description, the heating regions R will be set to heating regions R1 to R4 in that order from the center.

(Heating Process of the Heating Region R1)

Figure 7:
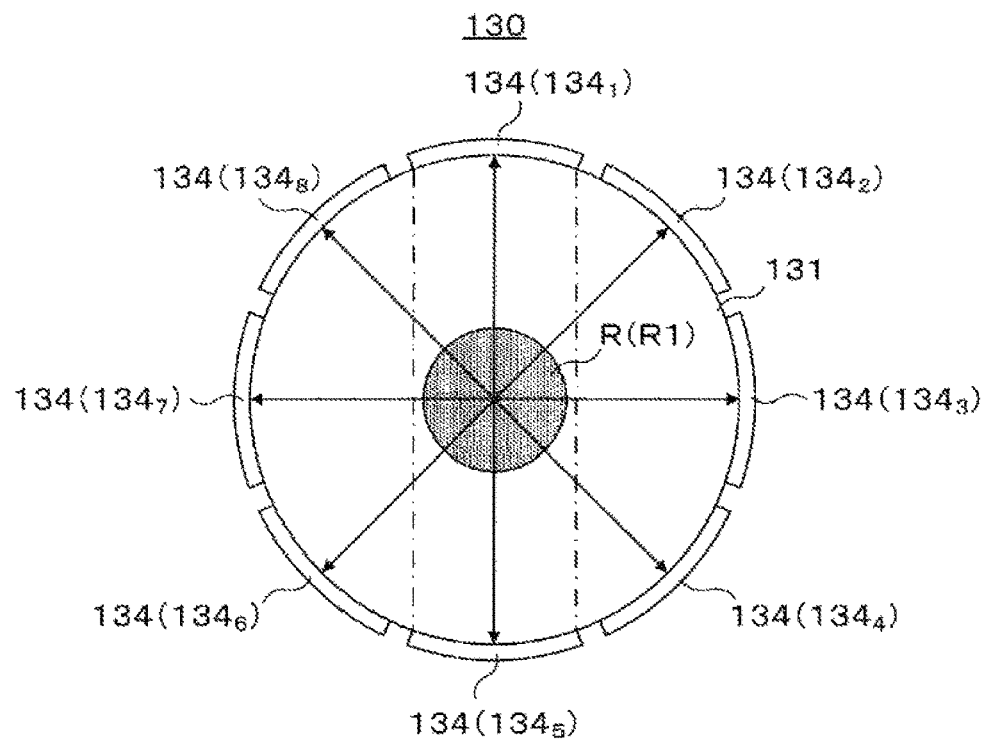
FIG. 7 shows a relationship between one heating region and sets of electrodes used for heating the heating region.

As shown in FIG. 7, the set of electrodes 134 used for heating the central heating region R1 is the set of conducting electrodes 134 between which a current flows through or near the heating region R1. Specifically, the following sets of electrodes 134 facing each other are set for the heating region R1.

(first electrode $134_1$, fifth electrode $134_5$)
(second electrode $134_2$, sixth electrode $134_6$)
(third electrode $134_3$, seventh electrode $134_7$)
(fourth electrode $134_4$, eighth electrode $134_8$)
(fifth electrode $134_5$, first electrode $134_1$)
(sixth electrode $134_6$, second electrode $134_2$)
(seventh electrode $134_7$, third electrode $134_3$)
(eighth electrode $134_8$, fourth electrode $134_4$)

In this specification, "(the $j^{th}$ electrode $134_j$, the $k^{th}$ electrode $134_k$)" indicates the set of electrodes 134 in which the electrode on the high potential side is the $j^{th}$ electrode 134 and the electrode on the low potential side is the $k^{th}$ electrode $134_k$.

Figure 8:
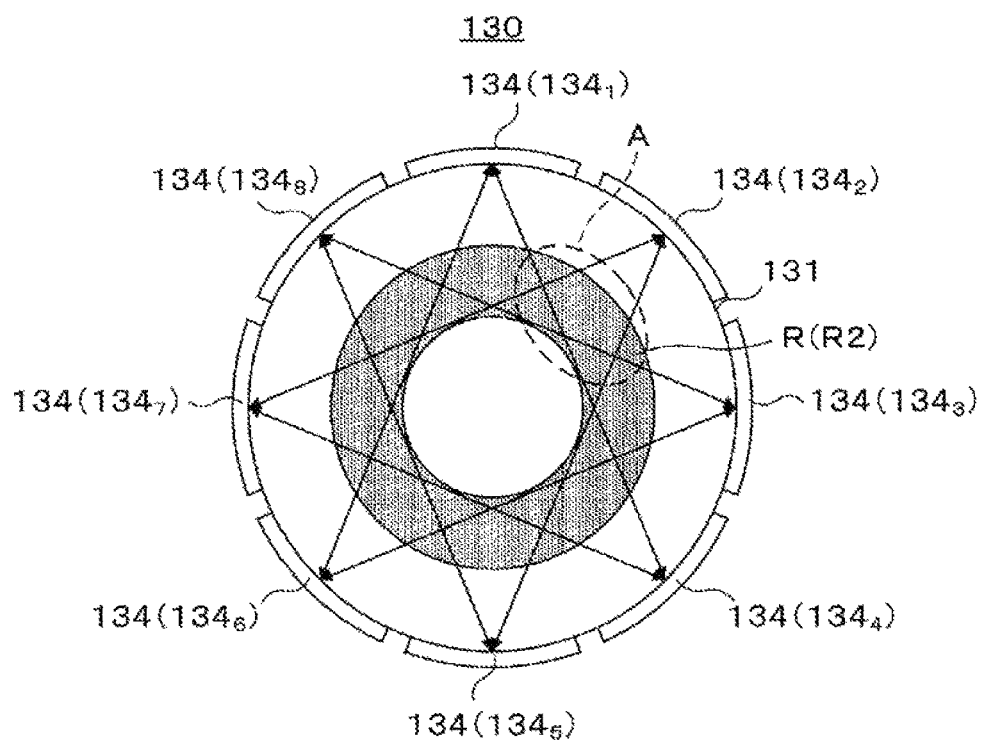
FIG. 8 shows a relationship between another heating region and sets of electrodes used for heating another heating region.

As shown in FIG. 8, the set of electrodes 134 used for heating the heating region R2 adjacent to the heating region R1 is the set of conducting electrodes 134 between which a current flows through or near the heating region R2. Specifically, the following sets of electrodes 134 are set for the heating region R2.

(first electrode $134_1$, fourth electrode $134_4$)
(first electrode $134_1$, sixth electrode $134_6$)
(second electrode $134_2$, fifth electrode $134_5$)
(second electrode $134_2$, seventh electrode $134_7$)
(third electrode $134_3$, sixth electrode $134_6$)
(third electrode $134_3$, eighth electrode $134_8$)
(fourth electrode $134_4$, seventh electrode $134_7$)
(fourth electrode $134_4$, first electrode $134_1$)
(fifth electrode $134_5$, eighth electrode $134_8$)
(fifth electrode $134_5$, second electrode $134_2$)
(sixth electrode $134_6$, first electrode $134_1$)
(sixth electrode $134_6$, third electrode $134_3$)
(seventh electrode $134_7$, second electrode $134_2$)
(seventh electrode $134_7$, fourth electrode $134_4$)
(eighth electrode $134_8$, third electrode $134_3$)
(eighth electrode $134_8$, fifth electrode $134_5$)

Figure 9:
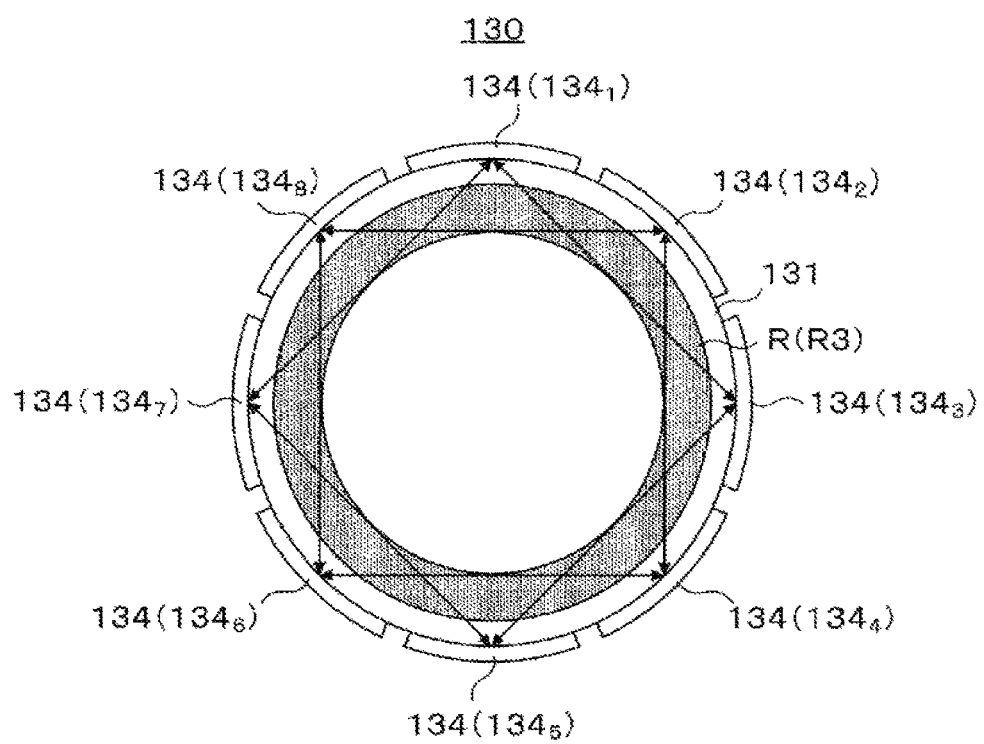
FIG. 9 shows a relationship between still another heating region and sets of electrodes used for heating still another heating region.

As shown in FIG. 9, the set of electrodes 134 used for heating the heating region R3 adjacent to the outer side of the heating region R2 is the set of conducting electrodes 134 between which a current flows through or near the heating region R3. Specifically, the following sets of electrodes 134 are set for the heating region R3.

(first electrode $134_1$, third electrode $134_3$)
(first electrode $134_1$, seventh electrode $134_7$)
(second electrode $134_2$, fourth electrode $134_4$)
(second electrode $134_2$, eighth electrode $134_8$)
(third electrode $134_3$, fifth electrode $134_5$)
(third electrode $134_3$, first electrode $134_1$)
(fourth electrode $134_4$, sixth electrode $134_6$)
(fourth electrode $134_4$, second electrode $134_2$)
(fifth electrode $134_5$, seventh electrode $134_7$)
(fifth electrode $134_5$, third electrode $134_3$)
(sixth electrode $134_6$, eighth electrode $134_8$)
(sixth electrode $134_6$, fourth electrode $134_4$)
(seventh electrode $134_7$, first electrode $134_1$)
(seventh electrode $134_7$, fifth electrode $134_5$)
(eighth electrode $134_8$, second electrode $134_2$)
(eighth electrode $134_8$, sixth electrode $134_6$)

Figure 10:
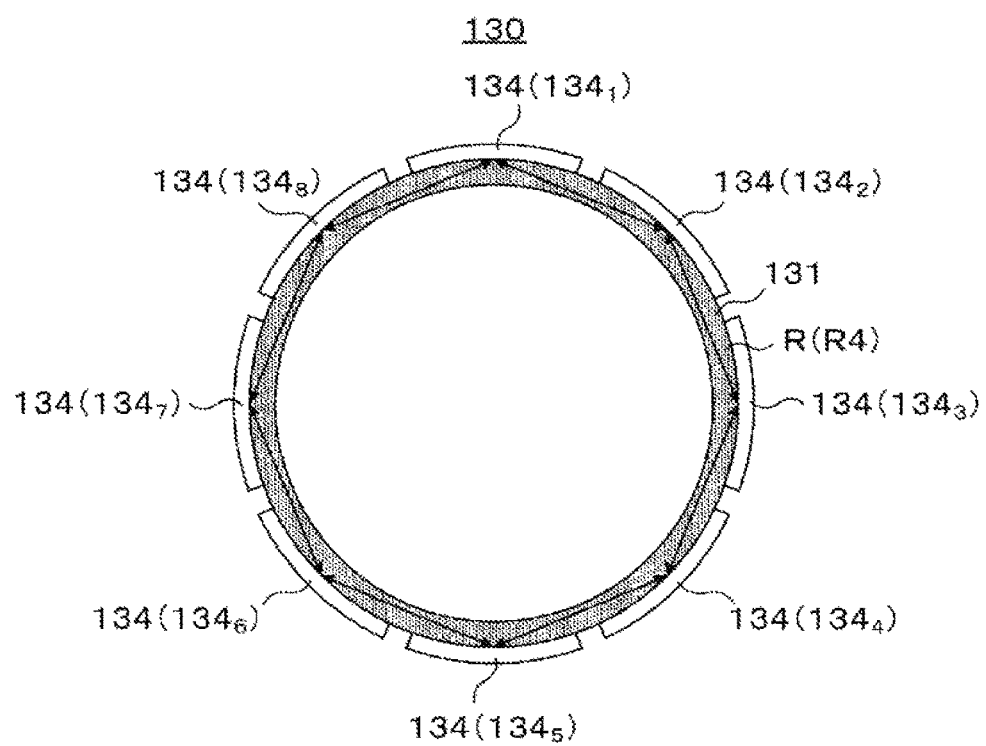
FIG. 10 shows a relationship between further still another heating region and sets of electrodes used for heating further still another heating region.

As shown in FIG. 10, the set of electrodes 134 used for heating the outermost heating region R4 adjacent to the outer side of the heating region R3 is the set of conducting electrodes 134 between which a current flows through or near the heating region R4. Specifically, the following sets of electrodes 134 are set for the heating region R4.

(first electrode $134_1$, second electrode $134_2$)
(first electrode $134_1$, eighth electrode $134_8$)
(second electrode $134_2$, third electrode $134_3$)
(second electrode $134_2$, first electrode $134_1$)
(third electrode $134_3$, fourth electrode $134_4$)
(third electrode $134_3$, second electrode $134_2$)
(fourth electrode $134_4$, fifth electrode $134_5$)
(fourth electrode $134_4$, third electrode $134_3$)
(fifth electrode $134_5$, sixth electrode $134_6$)
(fifth electrode $134_5$, fourth electrode $134_4$)
(sixth electrode $134_6$, seventh electrode $134_7$)
(sixth electrode $134_6$, fifth electrode $134_5$)
(seventh electrode $134_7$, eighth electrode $134_8$)
(seventh electrode $134_7$, sixth electrode $134_6$)
(eighth electrode $134_8$, first electrode $134_1$)
(eighth electrode $134_8$, seventh electrode $134_7$)

Figure 12:
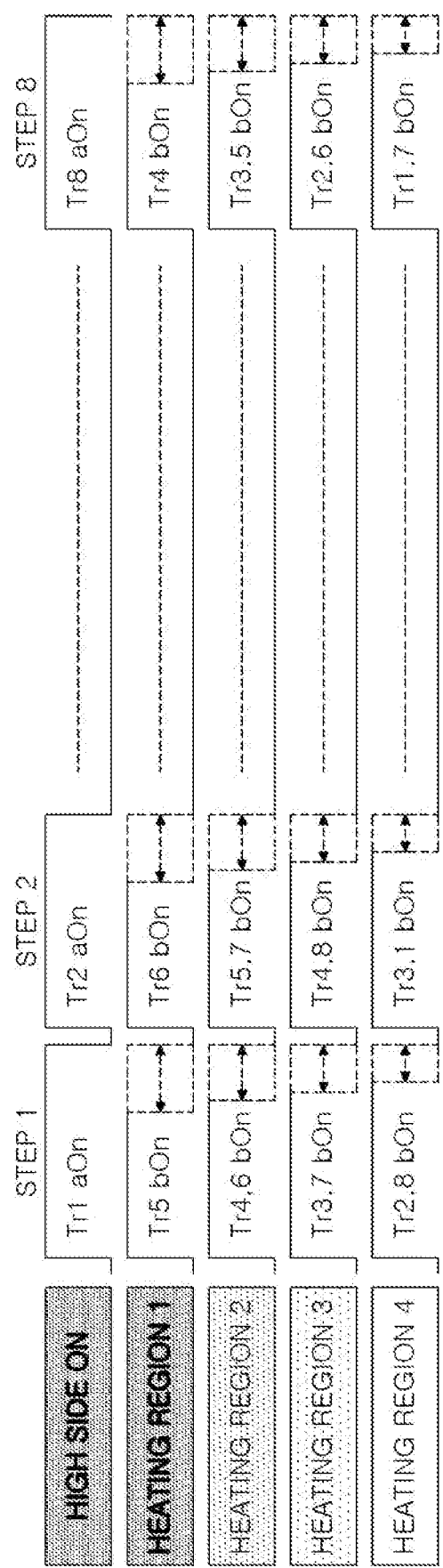
FIG. 12 explains a conducting time period in each step of each heating process of the temperature control process.

Next, the process of controlling a temperature of the heater 130 of the present embodiment will be described in detail with reference to FIGS. 11 and 12. FIG. 11 shows the transistors Tra and Trb of the switching unit 13c in an ON state in each heating process of the temperature control process. FIG. 12 shows a conducting time period in each step of each heating process of the temperature control process. In FIGS. 11 and 12, "Trm (m=1 to 8)" indicates a transistor pair corresponding to an $m^{th}$ electrode $134_m$ (m=1 to 8). Further, in FIGS. 11 and 12, "aON" indicates that the transistor Tra on the high potential side of the corresponding transistor pair is in an ON state, and "bON" indicates that the transistor Trb on the low potential side of the corresponding transistor pair is in an ON state. In FIG. 11, the transistor pair Trm indicated by a darkest gray background indicates the transistor pair Trm in which the transistor on the high potential side is in an ON state during the heating of each heating region R. Further, the transistor pair Trm indicated by a second darkest gray background indicates the transistor pair in which the transistor on the low potential side is in an ON state during the heating of the heating region R1; the transistor pair Trm indicated by a third darkest gray background indicates the transistor pair in which the transistor on the low potential side is in an ON state during the heating of the heating region R2; the transistor pair Trm indicated by a lightest gray background indicates the transistor pair in which the transistor on the low potential side is in an ON state during the heating of the heating region R3; and the transistor pair Trm indicated by a white background indicates the transistor pair in which the transistor on the low potential side is in an ON state during the heating of the heating region R4.

In the process of controlling a temperature of the heater 130 of the present embodiment, a step of heating the heating region R1 (Zone1), a step of heating the heating region R2 (Zone2), a step of heating the heating region R3 (Zone3), and a step of heating the heating region R4 (Zone 4) are repeated in that order. Further, in the step of heating each heating region R, the set of electrodes 134 to which the DC power from the DC power supply 13b is supplied is switched such that a conducting pattern between the electrodes 134 rotates. This will be described in detail below.

(Heating Process of the Heating Region R1)

In the heating process of the heating region R1, the following steps 1 to 8 are repeated sequentially.

In step 1, as shown in FIG. 11, in order to use the set of the first electrode $134_1$ and the fifth electrode $134_5$ as the set of the conducting electrodes 134, predetermined transistors of the switching unit 13c corresponding to the set of the first electrode $134_1$ and the fifth electrode $134_5$ are in an ON state. Specifically, only the transistor on the high potential side of the transistor pair Tr1 of the first electrode $134_1$ and the transistor on the low potential side of the transistor pair Tr5 of the fifth electrode $134_5$ are in an ON state.

In each of steps 2 to 8, as in step 1, in order to use each of the following sets of electrodes as the set of the conducting electrodes 134, the transistor Tra on the high potential side of one electrode of the corresponding set and the transistor Trb on the low potential side of the other electrode of the corresponding set are in an ON state.

Step 2: (second electrode $134_2$, sixth electrode $134_6$)
Step 3: (third electrode $134_3$, seventh electrode $134_7$)
Step 4: (fourth electrode $134_4$, eighth electrode $134_8$)
Step 5: (fifth electrode $134_5$, first electrode $134_1$)
Step 6: (sixth electrode $134_6$, second electrode $134_2$)
Step 7: (seventh electrode $134_7$, third electrode $134_3$)
Step 8: (eighth electrode $134_8$, fourth electrode $134_4$)

(Heating Process of the Heating Region R2)

In the heating process of the heating region R2, the following steps 1 to 8 are repeated in that order.

In step 1, in order to use the set of the first electrode $134_1$ and the fourth electrode $134_4$ and the set of the first electrode $134_1$ and the sixth electrode $134_6$ as the sets of the conducting electrodes 134, predetermined transistors of the switching unit 13c corresponding to the set of the first electrode $134_1$ and the fourth electrode $134_4$ and the set of the first electrode $134_1$ and the sixth electrode $134_6$ are in an ON state. Specifically, only the transistor on the high potential side of the transistor pair Tr1 of the first electrode $134_1$ that is common to both sets, and the transistor on the low potential side of the transistor pair Tr4 of the fourth electrode $134_4$ and the transistor on the low potential side of the transistor pair Tr6 of the sixth electrode $134_6$ are in an ON state.

In each of steps 2 to 8, as in step 1, in order to use each of the following sets of electrodes as the set of the conducting electrodes 134, the transistor Tra on the high potential side of one electrode of the corresponding set and the transistor Trb on the low potential side of the other electrode of the corresponding set are in an ON state.

Step 2: (second electrode $134_2$ and fifth electrode $134_5$) and (second electrode $134_2$ and seventh electrode $134_7$)
Step 3: (third electrode $134_3$ and sixth electrode $134_6$) and (third electrode $134_3$ and eighth electrode $134_8$)
Step 4: (fourth electrode $134_4$ and seventh electrode $134_7$) and (fourth electrode $134_4$ and first electrode $134_1$)
Step 5: (fifth electrode $134_5$ and eighth electrode $134_8$) and (fifth electrode $134_5$ and second electrode $134_2$)
Step 6: (sixth electrode $134_6$ and first electrode $134_1$) and (sixth electrode $134_6$ and third electrode $134_3$)
Step 7: (seventh electrode $134_7$ and second electrode $134_2$) and (seventh electrode $134_7$ and fourth electrode $134_4$)
Step 8: (eighth electrode $134_8$ and third electrode $134_3$) and (eighth electrode $134_8$ and fifth electrode $134_5$)

(Heating Process of the Heating Region R3)

In the heating process of the heating region R3, the following steps 1 to 8 are repeated sequentially.

In step 1, in order to use the set of the first electrode $134_1$ and the third electrode $134_3$ and the set of the first electrode $134_1$ and the seventh electrode $134_7$ as the sets of the conducting electrodes 134, predetermined transistors of the switching unit 13c corresponding to the set of the first electrode $134_1$ and the third electrode $134_3$ and the set of the first electrode $134_1$ and the seventh electrode $134_7$ are in an ON state. Specifically, only the transistor on the high potential side of the transistor pair Tr1 of the first electrode $134_1$ that is common to both sets, and the transistor on the low potential side of the transistor pair Tr3 of the third electrode $134_3$ and the transistor on the low potential side of the transistor pair Tr7 of the seventh electrode $134_7$ are in an ON state.

In each of steps 2 to 8, as in step 1, in order to use each of the following sets of electrodes as the set of the conducting electrodes 134, the transistor Tra on the high potential side of one electrode of the corresponding set and the transistor Trb on the low potential side of the other electrode of the corresponding set are in an ON state.

Step 2: (second electrode $134_2$ and fourth electrode $134_4$) and (second electrode $134_2$ and eighth electrode $134_8$)
Step 3: (third electrode $134_3$ and fifth electrode $134_5$) and (third electrode $134_3$ and first electrode $134_1$)
Step 4: (fourth electrode $134_4$ and sixth electrode $134_6$) and (fourth electrode $134_4$ and second electrode $134_2$)
Step 5: (fifth electrode $134_5$ and seventh electrode $134_7$) and (fifth electrode $134_5$ and third electrode $134_3$)
Step 6: (sixth electrode $134_6$ and eighth electrode $134_8$) and (sixth electrode $134_6$ and fourth electrode $134_4$)
Step 7: (seventh electrode $134_7$ and first electrode $134_1$) and (seventh electrode $134_7$ and fifth electrode $134_5$)
Step 8: (eighth electrode $134_8$ and second electrode $134_2$) and (eighth electrode $134_8$ and sixth electrode $134_6$)

(Heating Process of the Heating Region R4)

In the heating process of the heating region R4, the following steps 1 to 8 are repeated sequentially.

In step 1, in order to use the set of the first electrode $134_1$ and the second electrode $134_2$ and the set of the first electrode $134_1$ and the eighth electrode $134_8$ as the set of the conducting electrodes 134, predetermined transistors of the switching unit 13c corresponding to the set of the first electrode $134_1$ and the second electrode $134_2$ and the set of the first electrode $134_1$ and the eighth electrode $134_8$ are in an ON state. Specifically, only the transistor on the high potential side of the transistor pair Tr1 of the first electrode $134_1$ that is common to both sets, and the transistor on the low potential side of the transistor pair Tr2 of the second electrode $134_2$ and the transistor on the low potential side of the transistor pair Tr8 of the eighth electrode $134_8$ are in an ON state.

In each of steps 2 to 8, as in step 1, in order to use each of the following sets of electrodes as the set of the conducting electrodes 134, the transistor Tra on the high potential side of one electrode of the corresponding set and the transistor Trb on the low potential side of the other electrode of the corresponding set are in an ON state.

Step 2: (second electrode $134_2$ and third electrode $134_3$) and (second electrode $134_2$ and first electrode $134_1$)
Step 3: (third electrode $134_3$ and fourth electrode $134_4$) and (third electrode $134_3$ and second electrode $134_2$)
Step 4: (fourth electrode $134_4$ and fifth electrode $134_5$) and (fourth electrode $134_4$ and third electrode $134_3$)
Step 5: (fifth electrode $134_5$ and sixth electrode $134_6$) and (fifth electrode $134_5$ and fourth electrode $134_4$)
Step 6: (sixth electrode $1346$ and seventh electrode $134_7$) and (sixth electrode $134_6$ and fifth electrode $134_5$)
Step 7: (seventh electrode $134_7$ and eighth electrode $134_8$) and (seventh electrode $134_7$ and sixth electrode $134_6$)
Step 8: (eighth electrode $134_8$ and first electrode $134_1$) and (eighth electrode $134_8$ and seventh electrode $134_7$)

The duration of each step in each heating process is, e.g., $1\times10^{-3}$ to $5\times10^{-3}$ seconds.

Further, in the process of controlling a temperature of the heater 130 of the present embodiment, as shown in FIG. 12, the conducting time period between the electrodes 134 in each step of the heating process of each heating region R, i.e., the period of time in which both transistors Tra and Trb on the high potential side and the low potential side are in an ON state varies. More specifically, a duty ratio in each step of each heating process of the heating region R (the period of time in which the transistor Trb on the low potential side is in an ON state to the period of time in which the transistor Tra on the high potential side is in an ON state) varies.

Hereinafter, in the process of controlling a temperature of the heater 130 of the present embodiment, four heating processes including the heating process of the heating region R1, the heating process of the heating region R2, the heating process of the heating region R3, and the heating process of the heating region R4 are repeated sequentially. Further, in each of the four heating processes, one cycle from step 1 to step 8 is repeated the same number of times.

In the process of controlling a temperature of the heater 130 of the present embodiment, the duty ratio (i.e., the conducting time period between the electrodes 134) in the above step is set for each set of electrodes 134. For example, the duty ratio is set for each heating region R, i.e., for each heating process. Accordingly, the in-plane temperature distribution of the plate-shaped member 131 can be adjusted by setting the heating amount of each heating region R to be different or the same for each heating region.

The duty ratio for each heating region R is set based on, e.g., the distance between the electrodes 134 in the set of electrodes 134 used in the heating process of the corresponding heating region R. Therefore, the duty ratio is set to be long in the heating process of the heating region R1 where the distance between the electrodes 134 is long, for example. Further, the duty ratio is set to be short in the heating process of the heating region R4 where the distance between the electrodes 134 is short. By setting the duty ratio as described above, when the power supplied from the DC power supply 13b is constant, the heating amount of each heating region R becomes substantially the same, which makes it possible to achieve the in-plane uniformity of the heating of the plate-shaped member 131. Further, the duty ratio may be set based on an electrical resistance value between the electrodes 134 in the set of electrodes 134 used in the heating process of the heating region R. This also makes it possible to achieve the in-plane uniformity of the heating of the plate-shaped member 131.

Next, a process of uniformly heating the heater 130 that requires a heating process of heating the heater 130 with a large temperature rise (hereinafter, referred to as "temperature increasing process") will be described. In the following description, a temperature sensor (not shown) is disposed at each portion of the ceiling layer 110 of the stage 10 corresponding to each heating region R, and the temperature of each heating region R is measured at regular intervals.

When the set temperature of the heater 130 is considerably changed or when the operation of the heater 130 is started, the temperature increasing process of heating the heater 130 with a large temperature rise is performed.

In the temperature increasing process, only the heating process of the heating region R1 and the heating process of the heating region R2 in which the central portion of the heater 130 is heated are repeated, for example. At this time, the duty ratio in each step of each heating process is 100%. In the temperature increasing process, the heating region R3 and the heating region R4 are heated by the heat transferred from the heating region R1 and the heating region R2.

When the temperature measured by the temperature sensor disposed at the portion corresponding to the heating region R1 of the ceiling layer 110 of the stage 10 reaches a predetermined temperature such as a target temperature or the like, the temperature increasing process is ended.

Then, the heating process of the heating region R1, the heating process of the heating region R2, the heating process of the heating region R3, and the heating process of the heating region R4 are repeated sequentially.

The duty ratio in each step in each heating process of the heating region R is set based on, e.g., the distance between the electrodes 134 in the set of electrodes 134 used in the heating process of the heating region R, as described above.

Instead, the duty ratio in each step in each heating process of the heating region R may be set based on the temperature of the heating region R to be heated. For example, the duty ratio in the heating process of the heating region R3 is set to be lower than a current duty ratio by a predetermined value when the temperature measured by the temperature sensor disposed at the portion corresponding to the heating region R3 of the ceiling layer 110 of the stage 10 exceeds the target temperature. On the other hand, when the measured temperature is lower than the target temperature, the duty ratio in the heating process of the heating region R3 is set to be higher than the current duty ratio by the predetermined value.

Next, a method for manufacturing the stage 10 will be described.

The method for manufacturing the stage 10 includes a layer forming process of forming a Si oxide film on one side or both sides of a Si single crystal substrate and forming multiple layers including the heater 130, and a bonding process of bonding the layers adjacent to each other in the stacking direction of the multiple layers with the Si oxide film interposed therebetween. Hereinafter, the layer forming process and the bonding process will be described in detail.

The layer forming process includes: (A) a ceiling layer forming process, (B) an electromagnetic shield layer forming process, (C) a heater manufacturing process, (D) a lid layer forming process, and (E) a groove layer forming process. The diameter of the Si single crystal substrate used in each process is, e.g., 300 mm, and the thickness of each layer is 0.5 mm to 10 mm. The thickness of the Si oxide film formed in each process is, e.g., 1 μm to 10 μm. In the following description, it is assumed that each electrode used in the heater manufacturing process or the like is a metal film.

(A) Ceiling Layer Forming Process

In this process, the Si oxide film 111 is formed by performing thermal oxidation treatment on the surface of the Si single crystal substrate fabricated by cutting a Si ingot that corresponds to the back surface of the ceiling layer 110, and the ceiling layer 110 is formed.

(B) Electromagnetic Shield Layer Forming Process

In this process, the Si oxide films 121 and 122 are formed by performing thermal oxidation treatment on the front surface and the back surface of the Si single crystal substrate fabricated by cutting a Si ingot added with high-concentration impurities. Also, the electrode 123 is formed on the side surface of the Si single crystal substrate by metallizing treatment. Accordingly, the electromagnetic shield layer 120 is formed.

(C) Heater Manufacturing Process

In this process, the Si oxide films 132 and 133 are formed on the front surface and the back surface of the plate-shaped member 131 that is a Si single crystal substrate formed by cutting a Si ingot added with high-concentration impurities by performing thermal oxidation treatment. Also, the electrodes 134 are formed on the side surface of the plate-shaped member 131 by metallizing treatment. Accordingly, the heater 130 is manufactured.

(D) Lid Layer Forming Process

In this process, the Si oxide films 141 and 142 are formed on the front surface and the back surface of the Si single crystal substrate formed by cutting a Si ingot added with high-concentration impurities by performing thermal oxidation treatment. Also, the electrode 143 is formed on the side surface of the Si single crystal substrate by metallizing treatment. Accordingly, the lid layer 140 is formed.

(E) Groove Layer Forming Process

In this process, the grooves 151 are formed on the surface of the Si single crystal substrate formed by cutting a Si ingot that faces the lid layer 140 by performing etching or machining. Further, the Si oxide film 152 is formed on the surface of the Si single crystal substrate that faces the lid layer 140 by performing thermal oxidation treatment. Accordingly, the groove layer 150 is formed.

In the bonding process, the ceiling layer 110 and the electromagnetic shield layer 120 are bonded via the Si oxide film 111 and the Si oxide film 121; the electromagnetic shield layer 120 and the heater 130 are bonded via the Si oxide film 122 and the Si oxide film 132; the heater 130 and the lid layer 140 are bonded via the Si oxide film 133 and the Si oxide film 141; and the lid layer 140 and the groove layer 150 are bonded via the Si oxide film 142 and the Si oxide film 152.

For example, plasma-activated low-temperature bonding or room-temperature bonding that activates a bonding surface using an ion beam or the like is used for the bonding via the Si oxide films interposed between the layers.

Then, wiring is performed for each electrode.

As described above, in the present embodiment, the heater 130 is manufactured by forming the electrode 134 on the side surface of one plate-shaped member 131, and wiring is easy. Further, a semiconductor substrate such as a Si single crystal substrate having in-plane uniformity of an impurity concentration can be used as the plate-shaped member 131. Therefore, the heater 130 can be easily manufactured at a low cost. Further, in the present embodiment, in the process of heating the plate-shaped member 131 of the heater 130, a current is conducted between the electrodes 134 during the conducting time period set for each set of electrodes 134 while sequentially switching the set of the conducting electrodes 134. Therefore, the heating amount of the region in the plate-shaped member 131 that corresponds to the set of electrodes 134 can be adjusted by adjusting the conducting time period, thereby changing the in-plane temperature distribution of the plate-shaped member 131. Accordingly, the desired in-plane temperature distribution can be easily obtained in the heater 130.

Further, the heater 130 has a configuration in which electrodes 134 are formed on the side surface of one plate-shaped member, and it is not necessary to separately provide a wiring layer. Therefore, an apparatus having a laminated structure using the heater 130, such as the stage 10, can be easily manufactured.

In the above example, the eight electrodes 134 are formed along the side surface of the plate-shaped member 131 at intervals in the circumferential direction. However, the number of the electrodes 134 is not limited thereto. When the number of the electrodes 134 is greater than or equal to three, the temperature can be controlled more locally as the number of the electrodes 134 increases.

Figure 13:
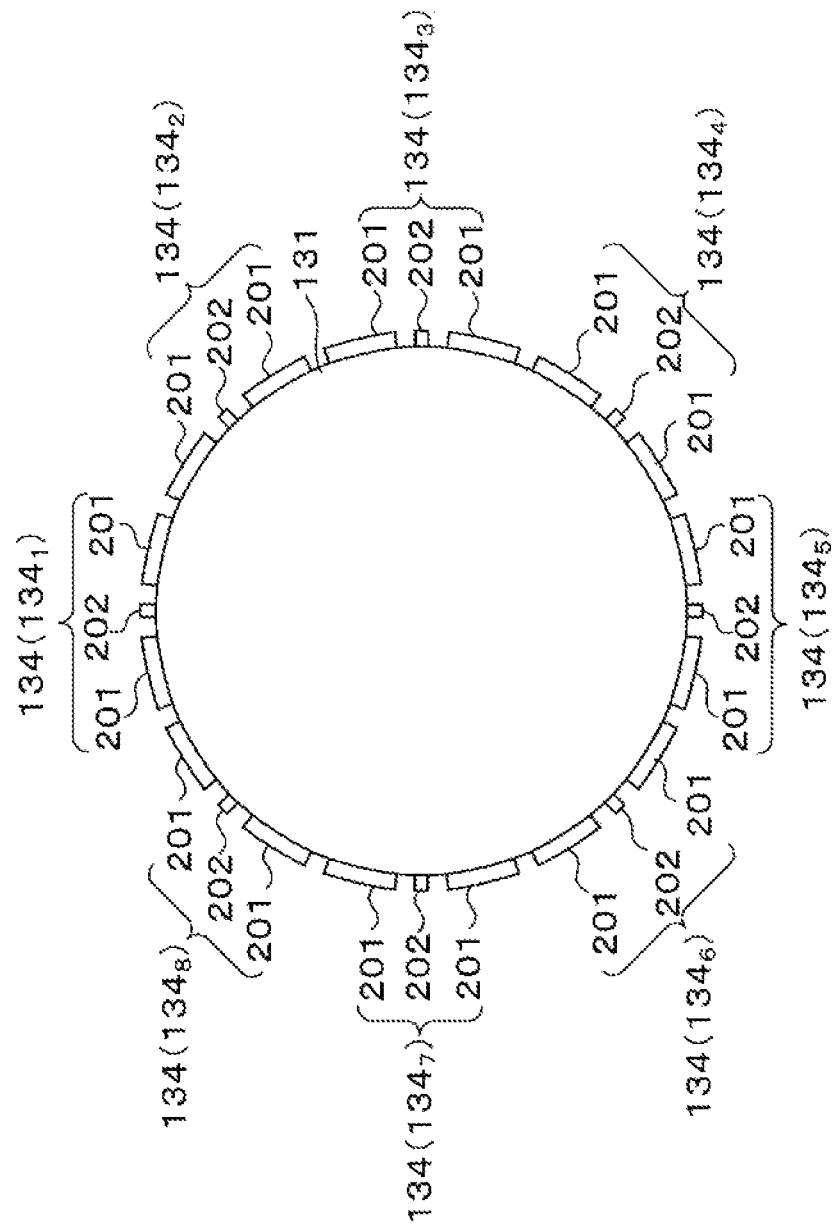
FIG. 13 shows another example of the electrodes.

FIG. 13 shows another example of the electrodes 134. FIG. 14 explains a process of controlling a temperature of the heater 130 in the case of using the electrode 134 in this example.

Each electrode 134 in FIG. 13 is divided into multiple parts in the circumferential direction, and has large-size electrodes 201 and small-size electrode 202 having a width in the circumferential direction smaller than that of the large-size electrodes 201. More specifically, each electrode 134 is divided in the circumferential direction into three parts including two large-size electrodes 201 and one small-size electrode 202 disposed between the two large-size electrodes 201.

When the current is conducted between the electrodes 134 in each heating process, as shown in FIGS. 14A to 14D, the current is conducted only between the small-size electrode 202 of one electrode 134 constituting the set of electrodes 134 and the small-size electrode 202 and the large-size electrodes 201 of the other electrode 134 constituting the set of electrodes 134. The current is not conducted between the large-size electrodes 201 of one electrode 134 and the large-size electrodes 201 of the other electrode 134.

Figure 14A:
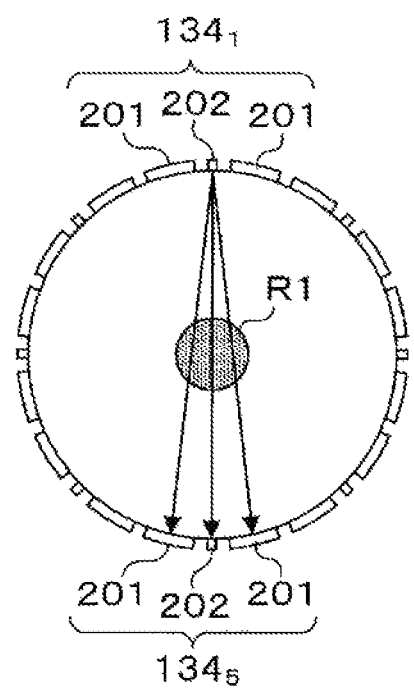
FIGS. 14A to 14D show a heat temperature control process in the case of using the electrodes of FIG. 13.

More specifically, in the process of heating the heating region R1, for example, as shown in FIG. 14A, when the current is conducted between the first electrode $134_1$ and the fifth electrode $134_5$, the current is conducted only between the small-size electrode 202 of the first electrode $134_1$ and the large-size electrodes 201 and the small-size electrode 202 of the fifth electrode $134_5$. The current is not conducted between the large-size electrodes 201 of the first electrode $134_1$ and the large-size electrodes 201 of the fifth electrode $134_5$.

Figure 14C:
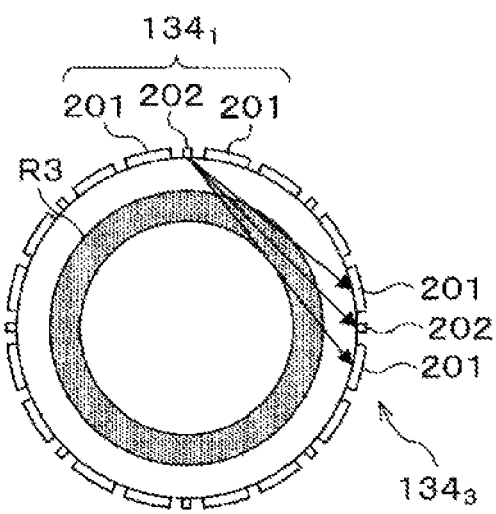
Figure 14B:
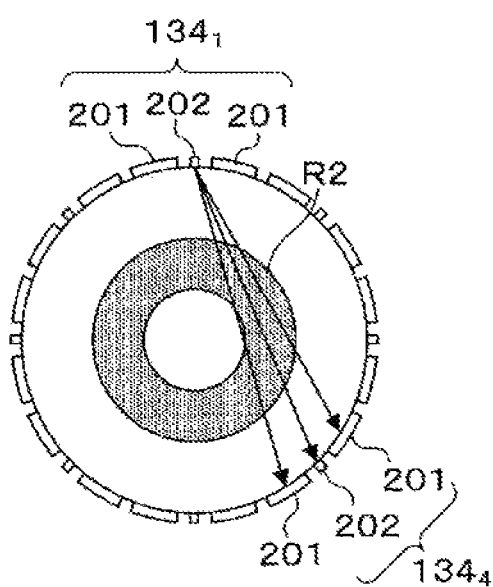

In the process of heating the heating region R2, for example, as shown in FIG. 14B, when the current is conducted between the first electrode $134_1$ and the fourth electrode $134_4$, the current is conducted only between the small-size electrode 202 of the first electrode $134_1$ and the large-size electrodes 201 and the small-size electrode 202 of the fourth electrode $134_4$. The current is not conducted between the large-size electrodes 201 of the first electrode $134_1$ and the large-size electrodes 201 of the fourth electrode $134_4$.

In the process of heating the heating region R3, for example, as shown in FIG. 14C, when the current is conducted between the first electrode $134_1$ and the third electrode $134_3$, the current is conducted only between the small-size electrode 202 of the first electrode $134_1$ and the large-size electrodes 201 and the small-size electrode 202 of the third electrode $134_3$. The current is not conducted between the large-size electrodes 201 of the first electrode $134_1$ and the large-size electrodes 201 of the third electrode $134_3$.

Figure 14D:
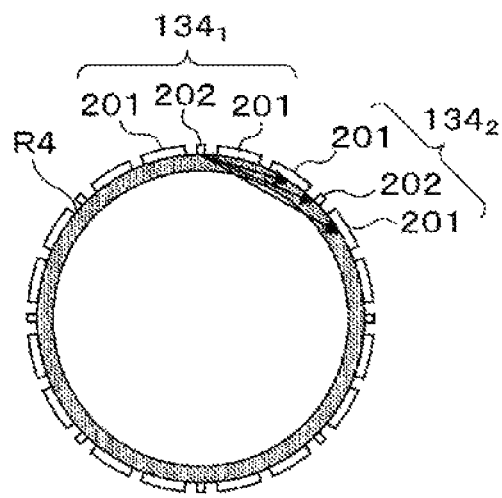

In the process of heating the heating region R4, for example, as shown in FIG. 14D, when the current is conducted between the first electrode $134_1$ and the second electrode $134_2$, the current is conducted only between the small-size electrode 202 of the first electrode $134_1$ and the large-size electrodes 201 and the small-size electrode 202 of the second electrode $134_2$. The current is not conducted between the large-size electrodes 201 of the first electrode $134_1$ and the large-size electrodes 201 of the second electrode $134_2$.

In the electrodes 134 of the example of FIG. 5, as indicated by virtual lines of FIG. 7, when the current is conducted between the electrodes 134, in the plate-shaped member 131, the current is concentrated on lines between both ends of the conducting electrodes 134, and almost no current flows in the central portion between the conducting electrodes 134.

On the other hand, in the electrodes 134 of the example of FIG. 13, when the current is conducted between the electrodes 134, in the plate-shaped member 131, the current also flows in the central portion between the conducting electrodes 134. Therefore, the central portion between the conducting electrodes 134 can also be heated.

The electrodes 134 in this example are particularly useful in the case of heating the central heating region R1 of the plate-shaped member 131.

The same effect can be obtained by simply increasing the number of electrodes 134, unlike this example. However, in the case of using the electrodes 134 in this example, the cost is low because the number of transistors Tra and Trb of the switching unit 13c, i.e., the number of switching elements, can be reduced compared to the case of simply increasing the number of electrodes 134. Further, since the electrodes 134 in this example have the small-size electrodes 202, the center portion of the plate-shaped member 131 can be heated more precisely compared to the case of simply increasing the number of electrodes 134, for example.

The width of the small-size electrode 202 in the circumferential direction is preferably smaller than or equal to $\frac{1}{10}$ of the diameter of the plate-shaped member 131, for example.

When conducting the electrode 134, the conducting time period between the small-size electrodes 202, the conducting time period between the small-size electrode 202 and one of the large-size electrodes 201, and the conducting time period between the small-size electrode 202 and the other large-size electrode 201 may be different, or may be set based on, e.g., the distance between the divided electrodes.

Figure 15:
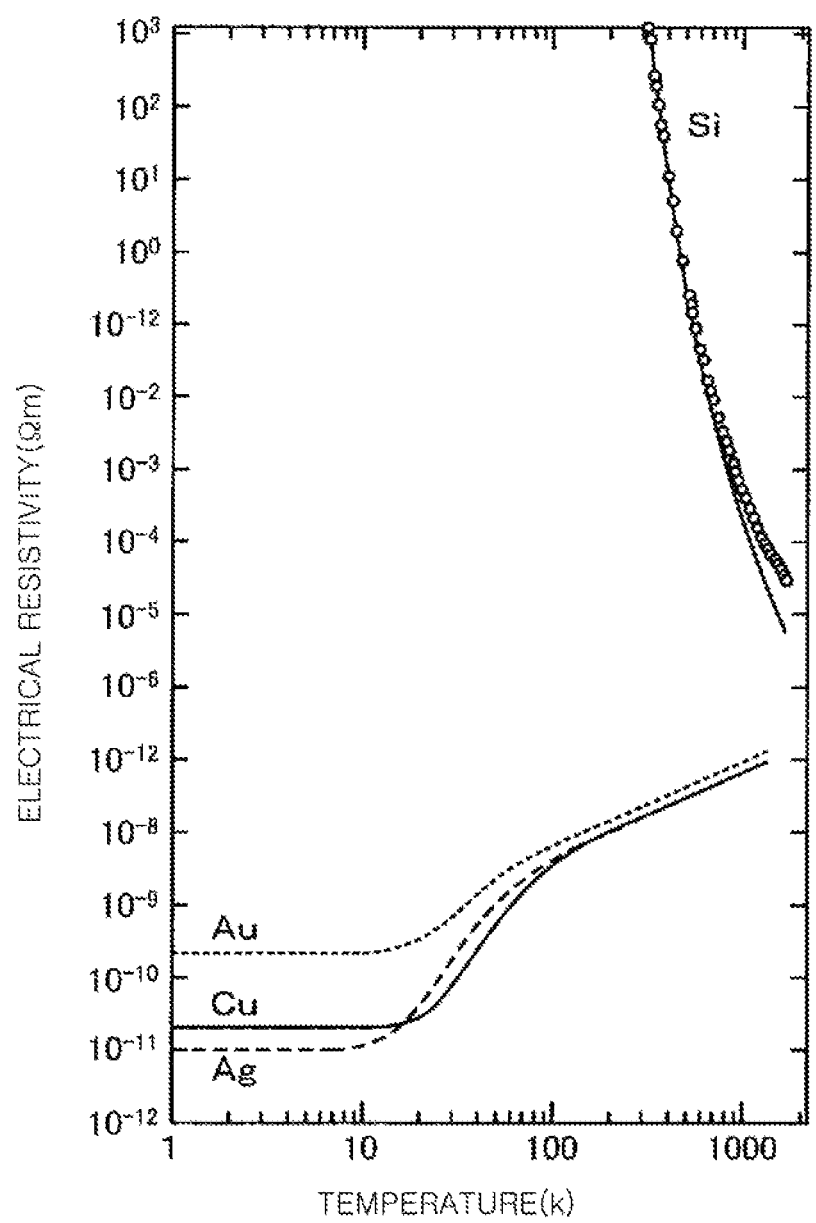
FIG. 15 shows another example of a method for measuring a temperature of a plate-shaped member of the heater.

FIG. 15 explains another example of a method for measuring a temperature of the plate-shaped member 131 of the heater 130.

In the above example, the temperature of the plate-shaped member 131 is measured by a temperature sensor (not shown) disposed at the ceiling layer 110 of the stage 10. More specifically, a temperature of each heating region R is measured by a temperature sensor disposed at a portion of the ceiling layer 110 of the stage 10 that corresponds to the corresponding heating region R.

The method for measuring a temperature of the plate-shaped member 131, specifically, the method for measuring a temperature of each heating region R is not limited thereto.

As shown in FIG. 15, Si forming the plate-shaped member 131 has an electrical resistivity that depends on a temperature. Specifically, the electrical resistivity tends to be decreased as the temperature is increased.

Therefore, the temperature of the plate-shaped member 131 may be estimated based on the electrical resistivity at the time of conducting the current between the electrode 134 and the other electrode 134, and the estimation result may be used as the measurement result. Specifically, for example, a predetermined voltage from the DC power supply 13b is applied between the electrodes 134 for each set of electrodes 134 used for heating the heating region R, and the current flowing at that time is measured. Next, the electrical resistance value is calculated from the predetermined voltage and the current measurement results, and the temperature is calculated/estimated based on a predetermined conversion formula from the calculation results. Then, the average value of the temperature estimation results for each set of electrodes 134 is calculated for each heating regions R, and the calculation result is used as the temperature measurement result of the corresponding heating region R.

More specifically, in the case of measuring the temperature of the heating region R1, for example, a predetermined voltage is applied from the DC power supply 13b to each set of electrodes 134 used for heating the heating region R1 (e.g., (the first electrode $134_1$ and the fifth electrode $134_5$) or (the second electrode $134_2$ and the sixth electrode $134_6$)). Then, the current flowing at that time is measured. The electrical resistance value is calculated from the predetermined voltage and the current measurement result, and the temperature between the electrodes 134 constituting each set of electrodes 134 is calculated/estimated from the calculation result based on the predetermined conversion formula. Then, the average value of the temperature estimation results is calculated, and the calculated result is used as the temperature measurement result of the heating region R1. The temperature measurement result of the heating region R1 is used for setting the duty ratio in the heating process of the heating region R1.

In the same manner, the temperatures of the heating regions R1 to R4 can be measured, and the measurement results can be used to set the duty ratio in each heating process of the heating regions R2 to R4.

The predetermined conversion formula for calculating the temperature from the electrical resistance value is created and acquired in advance. For example, a temperature sensor such as a thermocouple or the like is disposed on the plate-shaped member 131 before being assembled as the stage 10, and the predetermined conversion formula can be created from the temperature measurement result and the electrical resistance value between the electrodes 134 at that time.

The temperature measurement process is performed simultaneously with the heating processes of the heating regions or between the heating processes of the heating regions. For example, whenever the heating process of the heating region R is performed a predetermined number of times (e.g., five times or ten times), the temperature of the heating region R is measured. When the temperature measurement process is performed between the heating processes, the duty ratio in the temperature measurement process is constant. Further, when the temperature measurement process is performed simultaneously with the heating process, the duty ratio in the heating process is the duty ratio in the temperature measurement process, and the change in the duty ratio in the heating process indicates that the duty ratio in the temperature measurement process also varies depending on the execution timing of the process. The predetermined conversion formula that is suitable may be different depending on the duty ratio in the temperature measurement process. In this case, the predetermined conversion formula may be prepared for each duty ratio.

Since the voltage when the current is conducted between the electrodes 134 is necessary for the calculation of the electrical resistance value between the electrodes 134, for example, if the output from the DC power supply 13b is constant, the output voltage may be stored in a storage unit (not shown) in advance and used for calculating the electrical resistance value. Further, the voltage may be acquired by measurement.

Figure 16:
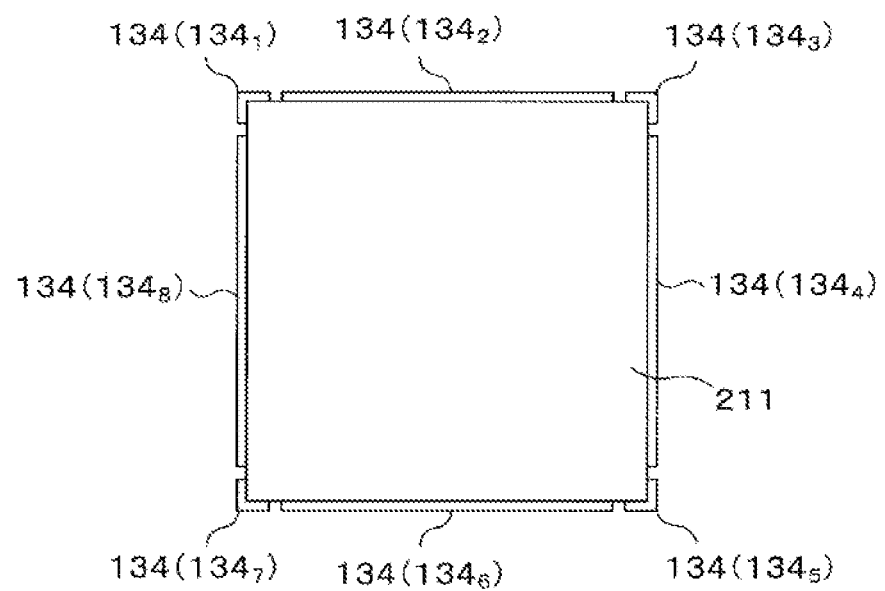
FIG. 16 is a top view schematically showing a configuration of another example of the heater.

FIG. 16 is a top view schematically showing a configuration of another example of the heater.

The heater 130 shown in FIG. 5 includes the plate-shaped member 131 having a circular shape in plan view, but the shape of the plate-shaped member 131 is not limited thereto. Similarly to the plate-shaped member 211 of the heater 210 in the example of FIG. 16, the plate-shaped member 131 may have a rectangular shape in plan view (square in this example).

In the above description, the duty ratio in each step of the heating process is set for each heating process. For example, in the heating process of the heating region R2, the duty ratio is common for the steps. However, instead, the duty ratio may be set for each step. For example, the duty ratio may be different between the steps of the heating process of the heating region R2. Accordingly, the heating amount can be decreased or increased only at a specific portion in each heating region R.

For example, in the heating process of the heating region R2, it is assumed that the duty ratio is set longer only in the step in which the second electrode 134$_2$ is included in the set of the conducting electrodes 134 than in the other steps in the heating process. In this case, the heating amount can be increased only at a specific portion A (see FIG. 8) close to the second electrode 134$_2$ in the heating region R2.

Such duty ratio setting is effective when there is a singular point in the in-plane temperature distribution around the heater 130. The singular point in the in-plane temperature distribution around the heater 130 is described as follows, for example. In other words, although the stage 10 has a cooling layer including the lid layer 140 and the groove layer 150, the portion near the inlet port through which the cooling medium is introduced into the cooling layer may have a lower temperature than the other portions. In this case, the portion near the inlet port of the cooling medium in the stage 10 may be the singular point in the in-plane temperature distribution around the heater 130.

In the above description, the in-plane temperature distribution of the heater 130 was adjusted by adjusting the heating amount of each heating region R by setting the duty ratio. Instead, the in-plane temperature distribution of the heater 130 can be adjusted by adjusting the heating amount of each heating region R by setting the duty ratio to be constant and setting the number of execution of the heating process of the heating region R1, the heating process of the heating region R2, the heating process of the heating region R3, and the heating process of the heating region R4 in one cycle to be different.

Further, in the above description, the heater 130 is formed of a Si single crystal substrate. However, the heater 130 may be formed of a Si polycrystalline substrate. This is the same in the layers constituting the stage 10 other than the heater 130.

The heater 130 may be made of an oxide-forming material such as an alumina or a silicon carbide single crystal substrate or polycrystalline substrate. However, since the Si single crystal substrates or the Si polycrystalline substrates can be obtained at a low cost due to a size of application fields in a semiconductor industry, the heater 130 can be manufactured at a low cost in the case of using such substrates. This is the same in the layers constituting the stage 10 other than the heater 130.

Further, in the above description, the DC power supply 13$b$ is used, and the DC power is used as the power for heating the heater 130. However, an AC power may also be used.

In the above description, the transistor is used as a switching element for switching the electrode 134 connected to the high potential side or the low potential side with respect to the power supply. However, another switching element may be used.

Further, in the above description, the number of electrodes 134 connected to the high potential side at the same time is limited to one. However, the number of electrodes 134 connected to the low potential side at the same time may be limited to one. The number of electrodes 134 connected to the high potential side at the same time and the number of electrodes 134 connected to the low potential side at the same time may be plural.

In the above description, the stage 10 is installed at the inspection apparatus 1. However, the stage 10 can be used for another processing apparatus for processing a processing target. The processing apparatus for processing a processing target is an apparatus for performing predetermined processing such as inspection, film formation, or the like on a processing target such as a wafer or the like.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

The following configurations also belong to the technical scope of the present disclosure.

(1) There is provided a method of controlling a temperature of a heater that includes a single plate-shaped member formed of a semiconductor substrate, and three or more electrodes formed on a side surface of the single plate-shaped member while being spaced apart from each other in a circumference direction. The method includes heating the plate-shaped member by conducting current between the electrodes and sequentially switching a set of the conducting electrodes among the electrodes. Further, in the heating of the plate-shaped member, a conducting time period for conducting the current between the conducting electrodes is set for each set of the conducting electrodes.

In the above method (1), the heater is manufactured by forming the electrodes on the side surface of the single plate-shaped member, and wiring is easy. Further, a semiconductor substrate such as a Si substrate having in-plane uniformity of an impurity concentration can be used as the plate-shaped member. Therefore, the heater can be easily manufactured at a low cost. Further, in the above method (1), in the heating of the plate-shaped member of the heater, a current is conducted between the electrodes during the conducting time period set for each set of electrodes while sequentially switching the set of conducting electrodes. Therefore, the heating amount of the region in the plate-shaped member that corresponds to the set of electrodes can be adjusted by adjusting the conducting time period, thereby changing the in-plane temperature distribution of the plate-shaped member. Accordingly, the desired in-plane temperature distribution can be easily obtained in the heater.

(2) In the method (1), the conducting time period is set based on a distance between the conducting electrodes or an electrical resistance value between the conducting electrodes.

In accordance with the above method (2), since the conducting time period between the electrodes is set based on the distance between the electrodes or the electrical resistance value, the in-plane uniformity of the temperature of the heater can be obtained.

(3) In the method of (1) or (2), the plate-shaped member is divided into multiple regions in a radial direction, and a set of electrodes having a positional relationship that is determined depending on each of the multiple regions is set as the set of the conducting electrodes used for heating the corresponding region.

(4) In the method of any one of (1) to (3), each of the electrodes is divided in a circumferential direction into large-size electrodes and a small-size electrode that has a circumferential width smaller than those of the large-size electrodes, and when the current is conducted in said heating, the current is conducted between a small-size electrode of one of the electrodes and a small-size electrode/large-size electrodes of another electrode of the electrodes, and the current is not conducted between large-size electrodes of said one of the electrodes and the large-size electrodes of said another electrode of the electrodes.

(5) The method of any one of (1) to (4) further includes measuring a temperature of the plate-shaped member based on an electrical resistance value when the current is conducted between one of the electrodes and another electrode of the electrodes.

(6) The method of (5) further includes adjusting the conducting time period based on a measurement result obtained in said measuring.

In accordance with the above method (6), the in-plane temperature distribution of the plate-shaped member can be adjusted based on the temperature measurement result.

(7) A heater includes a single plate-shaped member made of a semiconductor material, and three or more electrodes formed on side surface of the single plate-shaped member while being spaced apart from each other at intervals in a circumferential direction.

(8) A placement stand on which a processing target is placed includes the heater of the configuration (7).

DESCRIPTION OF REFERENCE NUMERALS

10: stage
130, 210: heater
131, 211: plate-shaped member
134: electrode

The invention claimed is:

1. A method of controlling a temperature of a heater that includes a single plate-shaped member formed of a semiconductor substrate, and a set of three or more electrodes formed on a side surface of the single plate-shaped member while being spaced apart from each other in a circumference direction, wherein the single plate-shaped member is divided into a plurality of concentric regions that include a first concentric region and a second concentric region that surrounds the first concentric region, the method comprising:

heating the first concentric region of the single plate-shaped member by sequentially driving each of a plurality of first sets of conducting electrodes that are associated with the first concentric region where each first set of conducting electrodes conducts conducting current between conducting electrodes included in the first set, the plurality of first sets of conducting electrodes from the set of three or more electrodes and each of the plurality of first sets of conducting electrodes having a first number of conducting, and heating the second concentric region by sequentially driving each of a plurality of second sets of conducting electrodes that are associated with the second concentric region where each second set of conducting electrodes conducts current between conducting electrodes included in the second set, the plurality of second sets of conducting electrodes from the set of three or more electrodes and each of the plurality of second sets of conducting electrodes having a second number of conducting electrodes that is different from the first number of conducting electrodes, wherein a first conducting time period for conducting the current between the conducting electrodes included in the plurality of first sets of conducting electrodes is set and a second conducting time period for conducting the current between the conducting electrodes included in the plurality of second sets of conducting electrodes is set.

2. The method of claim 1, wherein the first conducting time period is set based on a distance between the conducting electrodes included in the plurality of first sets of conducting electrodes or an electrical resistance value between the conducting electrodes included in the plurality of first sets of conducting electrodes.

3. The method of claim 1, wherein each of said three or more electrodes is divided in the circumferential direction into large-size electrodes and a small-size electrode that has a circumferential width smaller than those of the large-size electrodes, and when the current is conducted in said heating of the first concentric region, the current is conducted between a small-size electrode of one of the conducting electrodes of the first set of conducting electrodes and a small-size electrode/large-size electrodes of another conducting electrode of the first set of conducting electrodes, and the current is not conducted between large-size electrodes of said one of the conducting electrodes of the first set of conducting electrodes and the large-size electrodes of said another conducting electrode of the first set of conducting electrodes.

4. The method of claim 1, further comprising:
measuring a temperature of the single plate-shaped member based on an electrical resistance value when the current is conducted between conducting electrodes included in the plurality of first sets of conducting electrodes and current is conducted between conducting electrodes included in the plurality of second sets of conducting electrodes.

5. The method of claim 4, further comprising:
adjusting at least one of the first conducting time period and the second conducting time period based on a measurement result obtained in said measuring.

* * * * *